US009385052B2

(12) United States Patent
Lin et al.

(10) Patent No.: US 9,385,052 B2
(45) Date of Patent: Jul. 5, 2016

(54) SEMICONDUCTOR DEVICE AND METHOD OF FORMING BUILD-UP INTERCONNECT STRUCTURES OVER CARRIER FOR TESTING AT INTERIM STAGES

(71) Applicant: STATS ChipPAC, Ltd., Singapore (SG)

(72) Inventors: Yaojian Lin, Singapore (SG); Kang Chen, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 13/832,118

(22) Filed: Mar. 15, 2013

(65) Prior Publication Data
US 2014/0077361 A1   Mar. 20, 2014

Related U.S. Application Data

(60) Provisional application No. 61/701,366, filed on Sep. 14, 2012.

(51) Int. Cl.
*H01L 21/66* (2006.01)
*H01L 21/56* (2006.01)
(Continued)

(52) U.S. Cl.
CPC ............ *H01L 22/12* (2013.01); *H01L 21/56* (2013.01); *H01L 22/14* (2013.01); *H01L 22/20* (2013.01); *H01L 23/28* (2013.01); *H01L 23/3121* (2013.01); *H01L 23/3128* (2013.01); *H01L 23/49811* (2013.01); *H01L 23/49816* (2013.01); *H01L 23/49833* (2013.01); *H01L 23/5389* (2013.01); *H01L 24/19* (2013.01); *H01L 24/97* (2013.01); *H01L 25/105* (2013.01); *H01L 23/49822* (2013.01); *H01L 23/5383* (2013.01); *H01L 2224/16225* (2013.01); *H01L 2224/32225* (2013.01); *H01L 2224/48091* (2013.01); *H01L 2224/73204* (2013.01);
(Continued)

(58) Field of Classification Search
CPC ......... H01L 24/48; H01L 24/16; H01L 24/11; H01L 24/19; H01L 24/97; H01L 23/28; H01L 23/5389; H01L 21/56; H01L 21/6835; H01L 21/561
USPC .................................. 438/109, 108, 107, 106
See application file for complete search history.

(56) References Cited

U.S. PATENT DOCUMENTS 4,955,523 A   9/1990   Carlommagno et al.
5,371,654 A   12/1994  Beaman et al.
(Continued)

*Primary Examiner* — Michael Trinh
(74) *Attorney, Agent, or Firm* — Robert D. Atkins; Patent Law Group: Atkins and Associates; P.C.

(57) ABSTRACT

A semiconductor device has a first interconnect structure formed over the carrier. A semiconductor die is disposed over the first interconnect structure after testing the first interconnect structure to be known good. The semiconductor die in a known good die. A vertical interconnect structure, such as a bump or stud bump, is formed over the first interconnect structure. A discrete semiconductor device is disposed over the first interconnect structure or the second interconnect structure. An encapsulant is deposited over the semiconductor die, first interconnect structure, and vertical interconnect structure. A portion of the encapsulant is removed to expose the vertical interconnect structure. A second interconnect structure is formed over the encapsulant and electrically connected to the vertical interconnect structure. The first interconnect structure or the second interconnect structure includes an insulating layer with an embedded glass cloth, glass cross, filler, or fiber.

30 Claims, 17 Drawing Sheets

(51) Int. Cl.
*H01L 23/498* (2006.01)
*H01L 23/28* (2006.01)
*H01L 23/00* (2006.01)
*H01L 25/10* (2006.01)
*H01L 23/31* (2006.01)
*H01L 23/538* (2006.01)

(52) U.S. Cl.
CPC ............... *H01L 2224/73265* (2013.01); *H01L 2224/73267* (2013.01); *H01L 2224/81005* (2013.01); *H01L 2224/92125* (2013.01); *H01L 2224/92244* (2013.01); *H01L 2225/1023* (2013.01); *H01L 2225/1041* (2013.01); *H01L 2225/1058* (2013.01); *H01L 2924/01322* (2013.01); *H01L 2924/12041* (2013.01); *H01L 2924/12042* (2013.01); *H01L 2924/1305* (2013.01); *H01L 2924/1306* (2013.01); *H01L 2924/13091* (2013.01); *H01L 2924/15311* (2013.01); *H01L 2924/181* (2013.01); *H01L 2924/19105* (2013.01); *H01L 2924/19107* (2013.01)

(56) References Cited

U.S. PATENT DOCUMENTS

| | | | |
|---|---|---|---|
| 5,455,390 A | 10/1995 | DiStefano et al. | |
| 5,495,667 A | 3/1996 | Farnworth et al. | |
| 5,601,740 A | 2/1997 | Eldridge et al. | |
| 5,635,767 A * | 6/1997 | Wenzel | H01L 23/642 257/691 |
| 6,133,072 A | 10/2000 | Fjelstad | |
| 6,207,549 B1 | 3/2001 | Higashi et al. | |
| 6,476,503 B1 | 11/2002 | Imamura et al. | |
| 6,477,768 B1 | 11/2002 | Wildner | |
| 6,690,090 B2 | 2/2004 | Kimura | |
| 6,972,496 B2 | 12/2005 | Choi | |
| 7,227,095 B2 | 6/2007 | Roberts et al. | |
| 7,497,694 B2 | 3/2009 | Kariya et al. | |
| 7,608,921 B2 | 10/2009 | Pendse | |
| 7,855,462 B2 | 12/2010 | Boon et al. | |
| 7,994,431 B2 * | 8/2011 | Yamano et al. | 174/260 |
| 8,035,210 B2 | 10/2011 | Yang et al. | |
| 8,035,211 B2 | 10/2011 | Ko et al. | |
| 8,138,017 B2 | 3/2012 | Chin | |
| 8,174,119 B2 | 5/2012 | Pendse | |
| 8,193,034 B2 | 6/2012 | Pagaila et al. | |
| 8,466,544 B2 | 6/2013 | Pagaila | |
| 2007/0108583 A1 | 5/2007 | Shim et al. | |
| 2009/0072375 A1 | 3/2009 | Song et al. | |
| 2009/0166835 A1 * | 7/2009 | Yang et al. | 257/686 |
| 2009/0273094 A1 | 11/2009 | Ha et al. | |
| 2010/0214759 A1 | 8/2010 | Beddingfield et al. | |
| 2010/0244222 A1 | 9/2010 | Chi et al. | |
| 2010/0270656 A1 | 10/2010 | Do et al. | |
| 2011/0241193 A1 * | 10/2011 | Ding | H01L 21/6835 257/686 |
| 2011/0285005 A1 * | 11/2011 | Lin | H01L 21/4846 257/686 |
| 2012/0018900 A1 | 1/2012 | Pagaila et al. | |
| 2012/0038064 A1 | 2/2012 | Camacho et al. | |
| 2012/0049366 A1 | 3/2012 | Zeng | |
| 2012/0056329 A1 | 3/2012 | Pagaila et al. | |
| 2012/0119388 A1 | 5/2012 | Cho et al. | |
| 2012/0217645 A1 | 8/2012 | Pagaila | |
| 2012/0273960 A1 | 11/2012 | Park et al. | |
| 2012/0286419 A1 * | 11/2012 | Kwon et al. | 257/737 |
| 2013/0147041 A1 | 6/2013 | Chan et al. | |
| 2013/0270682 A1 | 10/2013 | Hu et al. | |
| 2013/0292850 A1 | 11/2013 | Chua et al. | |

* cited by examiner

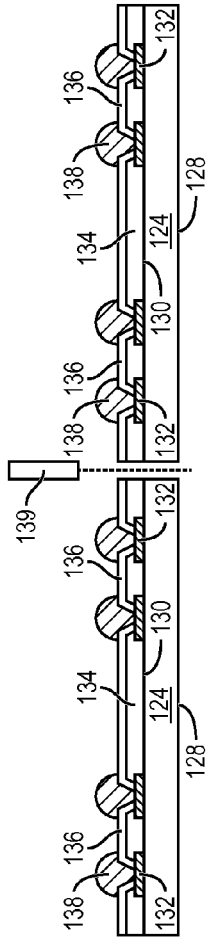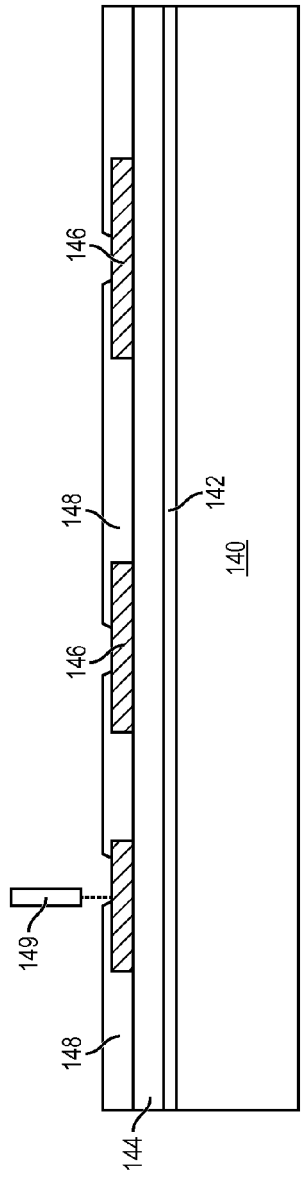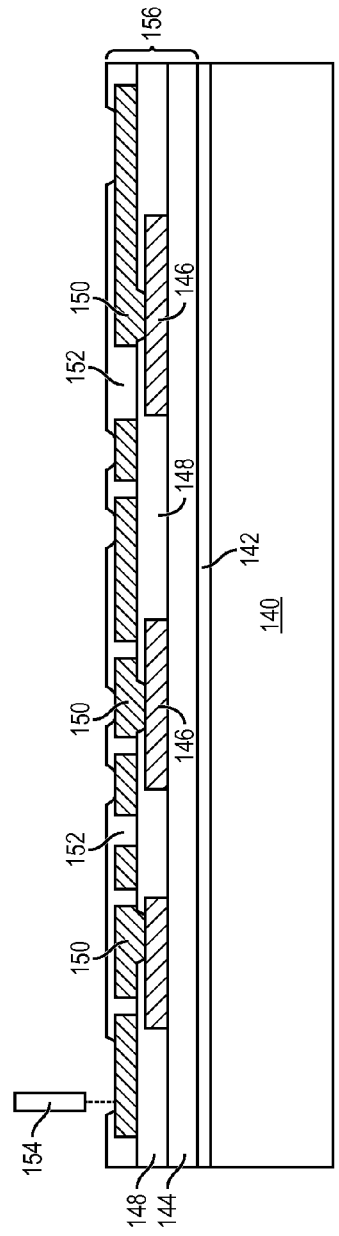

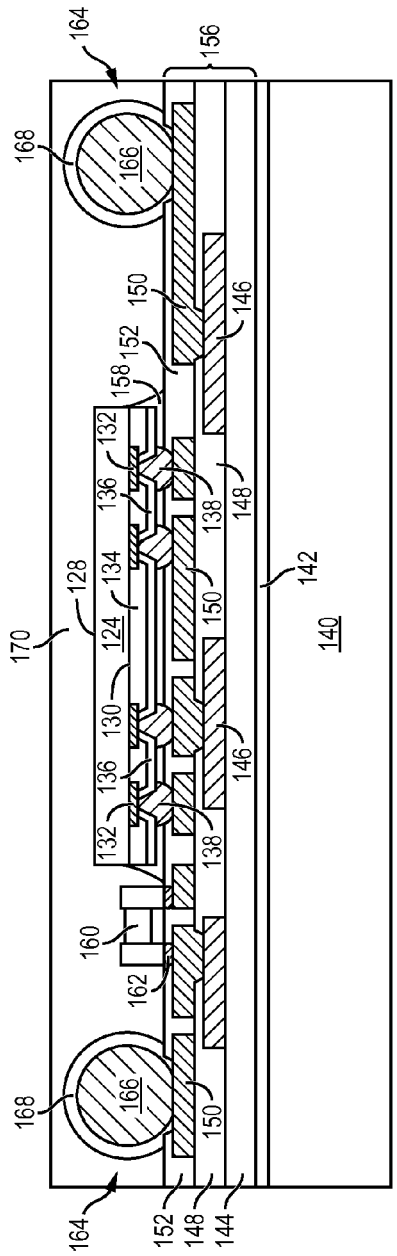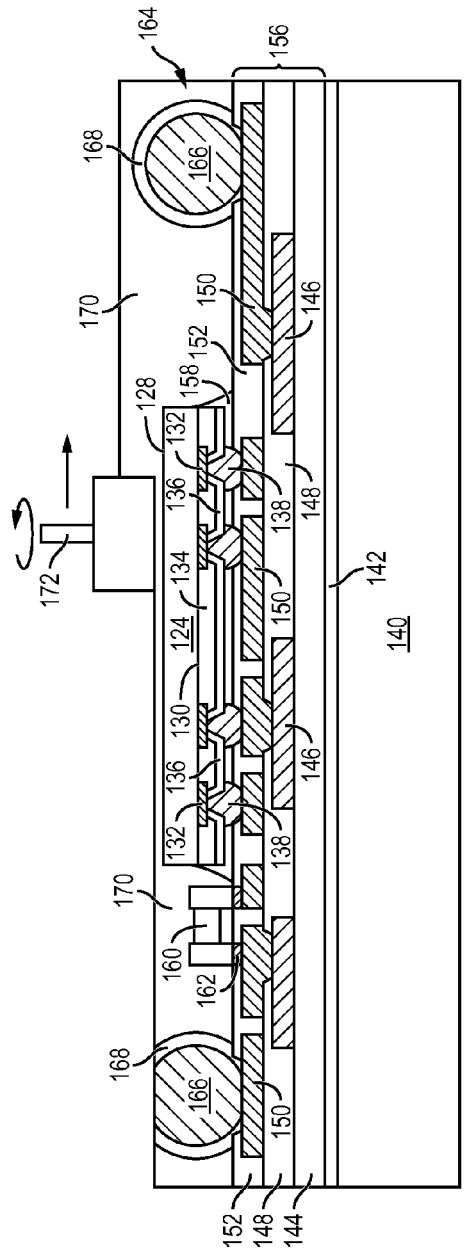

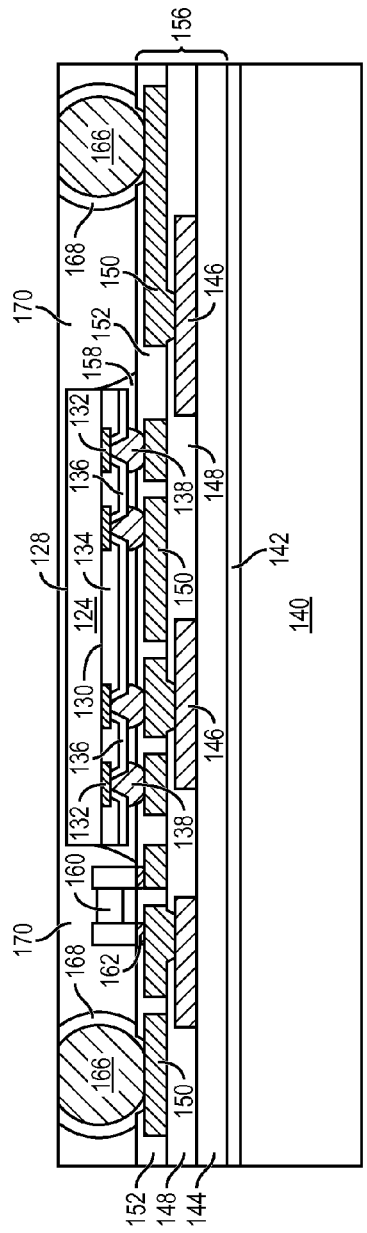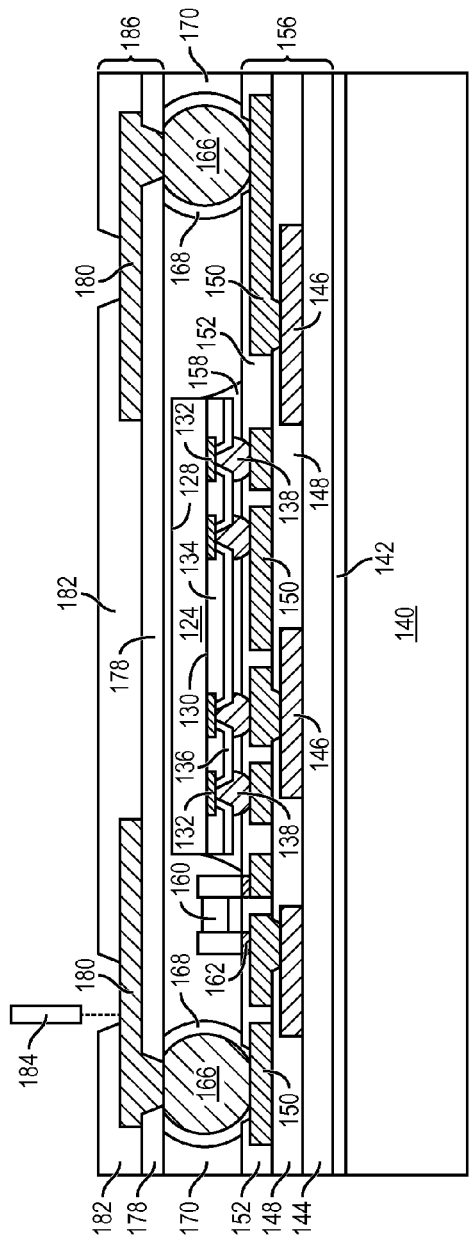

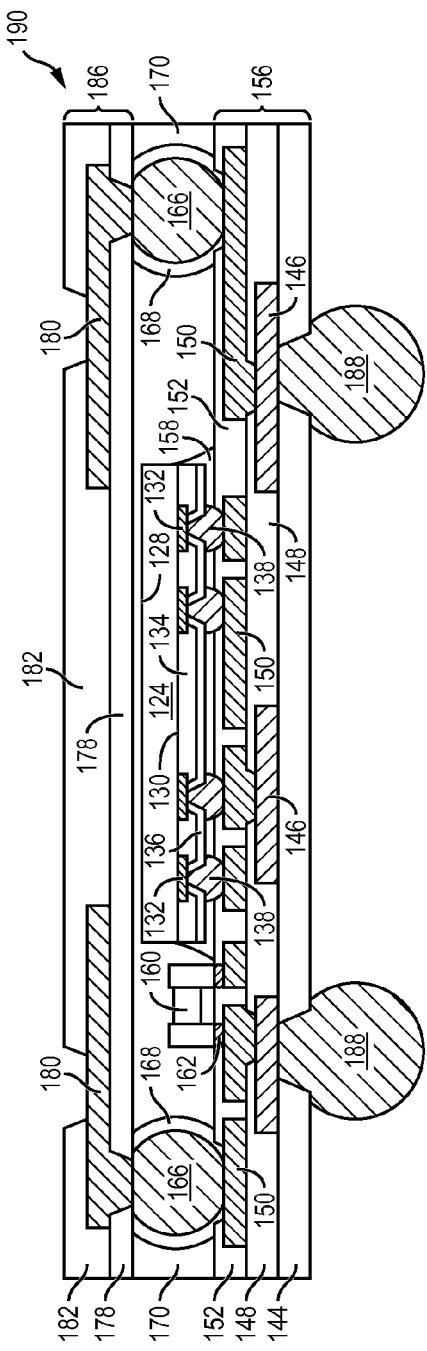
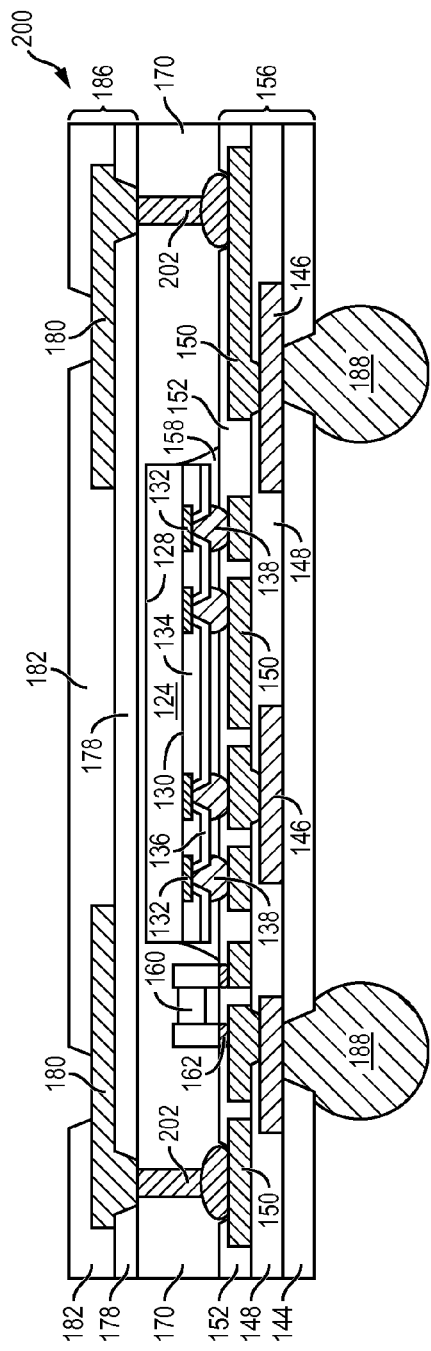

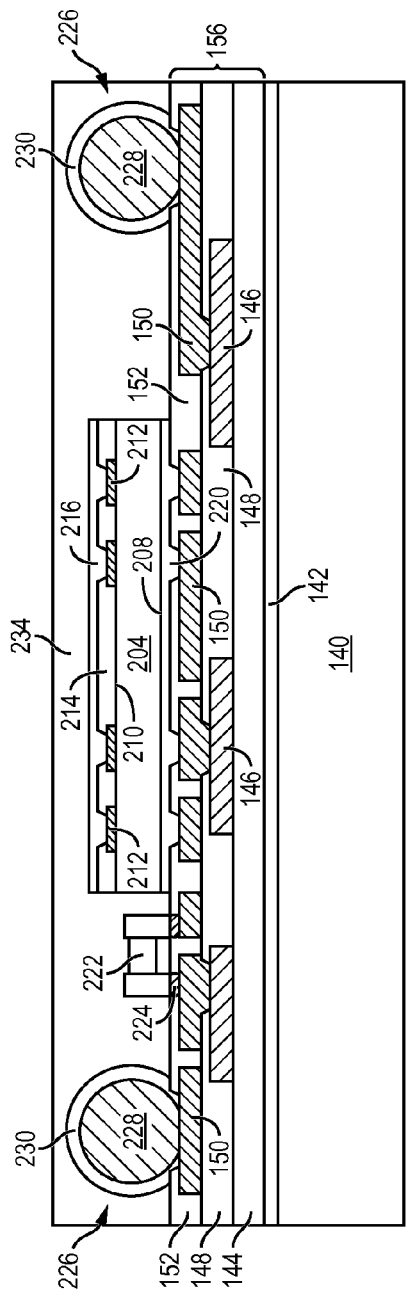
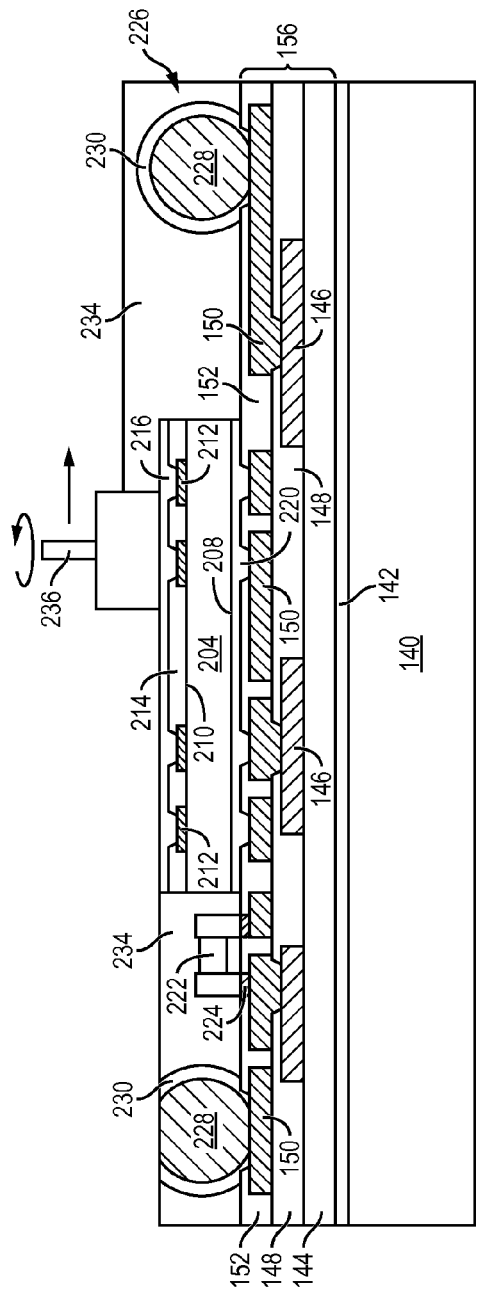
FIG. 6c
FIG. 6d

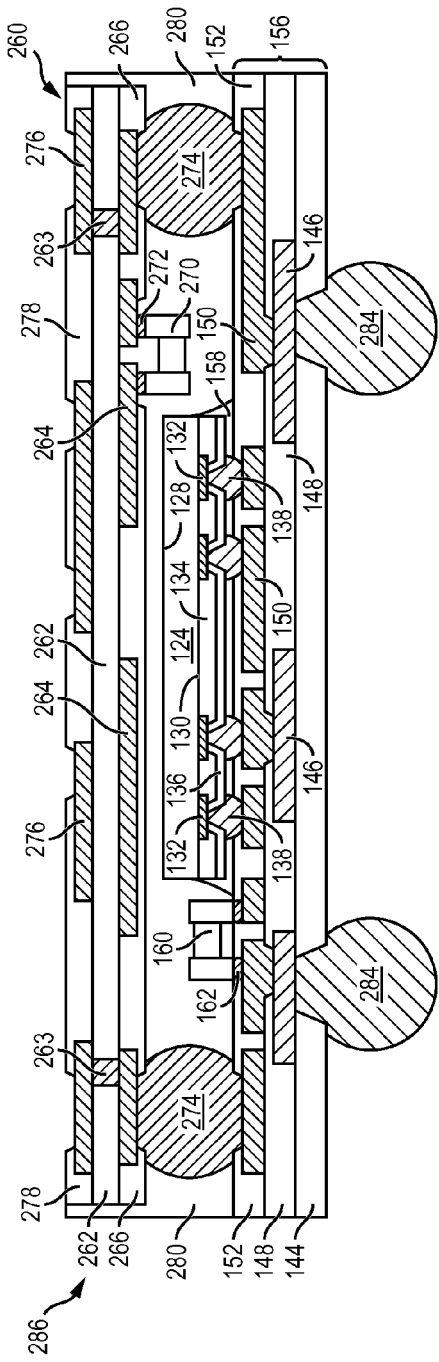
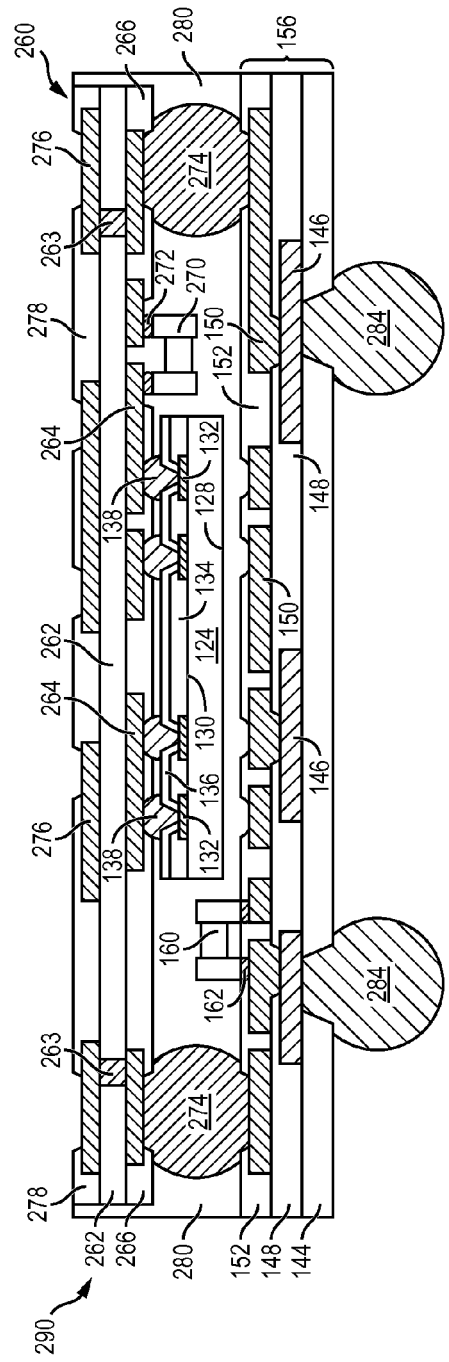
FIG. 7d
FIG. 8

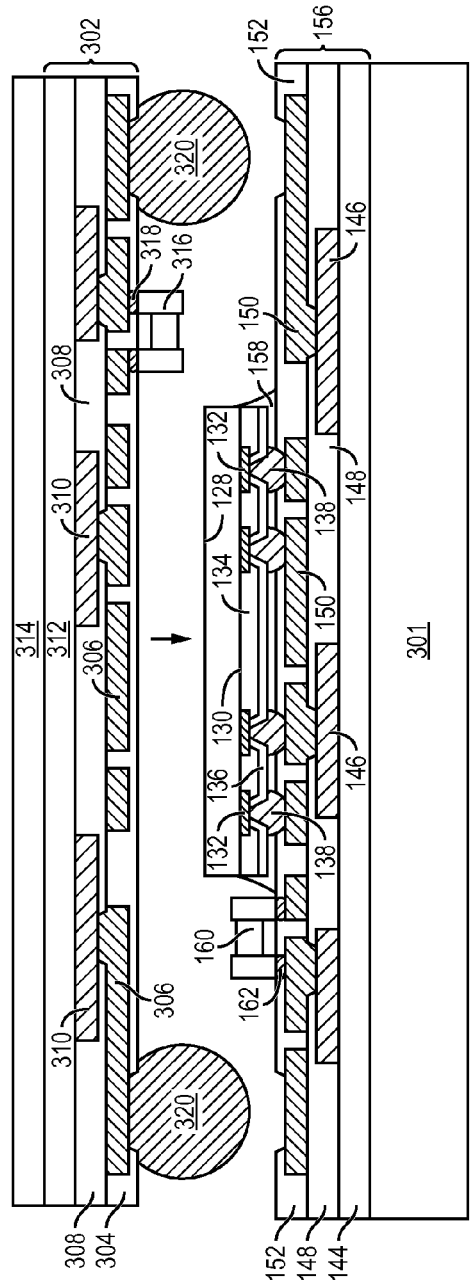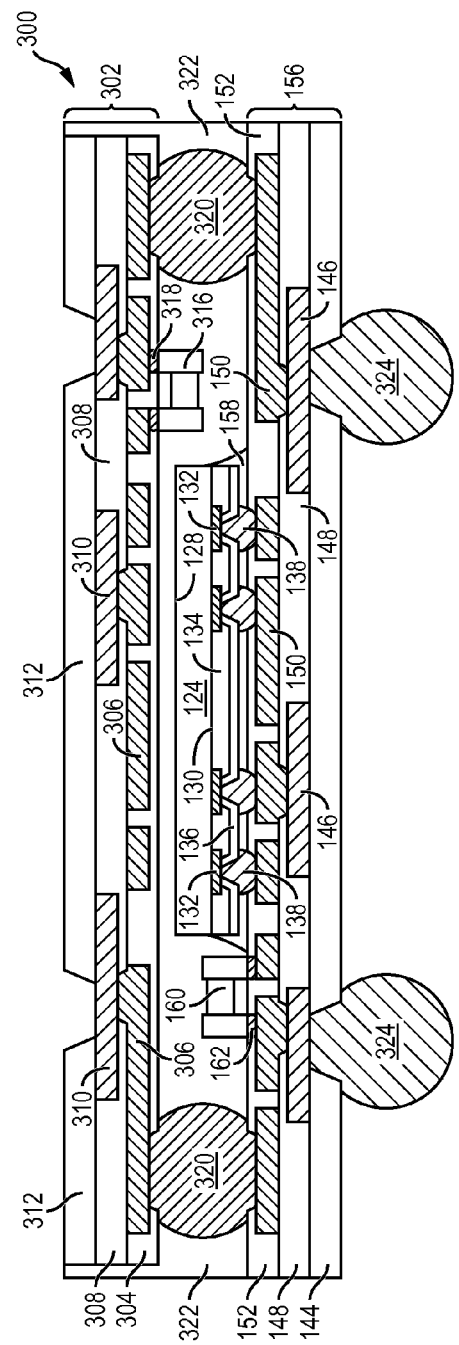
FIG. 9a
FIG. 9b

SEMICONDUCTOR DEVICE AND METHOD OF FORMING BUILD-UP INTERCONNECT STRUCTURES OVER CARRIER FOR TESTING AT INTERIM STAGES

CLAIM TO DOMESTIC PRIORITY

The present application claims the benefit of U.S. Provisional Application No. 61/701,366, filed Sep. 14, 2012, which application is incorporated herein by reference.

CROSS REFERENCE TO RELATED APPLICATIONS

The present application is related to U.S. patent application Ser. No. 13/832,205, filed Mar. 15, 2013, entitled "Semiconductor Device and Method of Forming Dual-Sided Interconnect Structures in Fo-WLCSP." The present application is further related to U.S. patent application Ser. No. 13/832,449, filed Mar. 15, 2013, entitled "Semiconductor Device and Method of Forming Dual-Sided Interconnect Structures in Fo-WLCSP."

FIELD OF THE INVENTION

The present invention relates in general to semiconductor devices and, more particularly, to a semiconductor device and method of forming build-up interconnect structures over carrier for testing at interim stages.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A semiconductor die can be tested to be a known good die (KGD) prior to mounting in a semiconductor package, e.g., a fan-out wafer level chip scale package (Fo-WLCSP). The semiconductor package can still fail due to defects in the build-up interconnect structure, causing loss of the KGD. A semiconductor package size greater than 10 by 10 millimeter (mm) with fine line spacing and multilayer structures is particularly susceptible to defects in the build-up interconnect structure. The larger size Fo-WLCSP is also subject to warpage defects.

SUMMARY OF THE INVENTION

A need exists to test the build-up interconnect structure prior to mounting a KGD in a Fo-WLCSP. Accordingly, in one embodiment, the present invention is a method of making a semiconductor device comprising the steps of providing a carrier, forming a first interconnect structure over the carrier, testing the first interconnect structure, disposing a semiconductor die over the first interconnect structure after testing the first interconnect structure, forming a vertical interconnect structure over the first interconnect structure, depositing an encapsulant over the semiconductor die, first interconnect structure, and vertical interconnect structure, and forming a second interconnect structure over the encapsulant and electrically coupled to the vertical interconnect structure.

In another embodiment, the present invention is a method of making a semiconductor device comprising the steps of forming a first known good interconnect structure, disposing a semiconductor die over the first known good interconnect structure, depositing an encapsulant over the semiconductor die and first known good interconnect structure, and forming a second interconnect structure over the encapsulant.

In another embodiment, the present invention is a method of making a semiconductor device comprising the steps of providing a first interconnect structure, forming a vertical interconnect structure over the first interconnect structure, providing a second interconnect structure, disposing the first interconnect structure over the second interconnect structure, disposing a semiconductor die over the first interconnect structure or second interconnect structure, and depositing an encapsulant over the semiconductor die.

In another embodiment, the present invention is a semiconductor device comprising a first known good first interconnect structure and semiconductor die disposed over the first known good interconnect structure. An encapsulant is deposited over the semiconductor die and first known good interconnect structure. A second interconnect structure is formed over the encapsulant.

BRIEF DESCRIPTION OF THE DRAWINGS

FIGS. 3a-3c illustrate a semiconductor wafer with a plurality of semiconductor die separated by a saw street;

FIGS. 4a-4i illustrate a process of forming top and bottom build-up interconnect structures over carrier for testing at interim stages;

FIG. 5 illustrates a Fo-WLCSP with a stud bump disposed between the top and bottom build-up interconnect structures;

FIGS. 6a-6f illustrate another process of forming top and bottom build-up interconnect structures over carrier for testing at interim stages;

FIGS. 7a-7d illustrate a first build-up interconnect structure mounted to a second build-up interconnect structures;

FIG. 8 illustrates a Fo-WLCSP with top and bottom build-up interconnect structures and a semiconductor die mounted to the top build-up interconnect structure;

FIGS. 9a-9b illustrate another type of first build-up interconnect structure mounted to a second build-up interconnect structures.

DETAILED DESCRIPTION OF THE DRAWINGS

Figure 1:
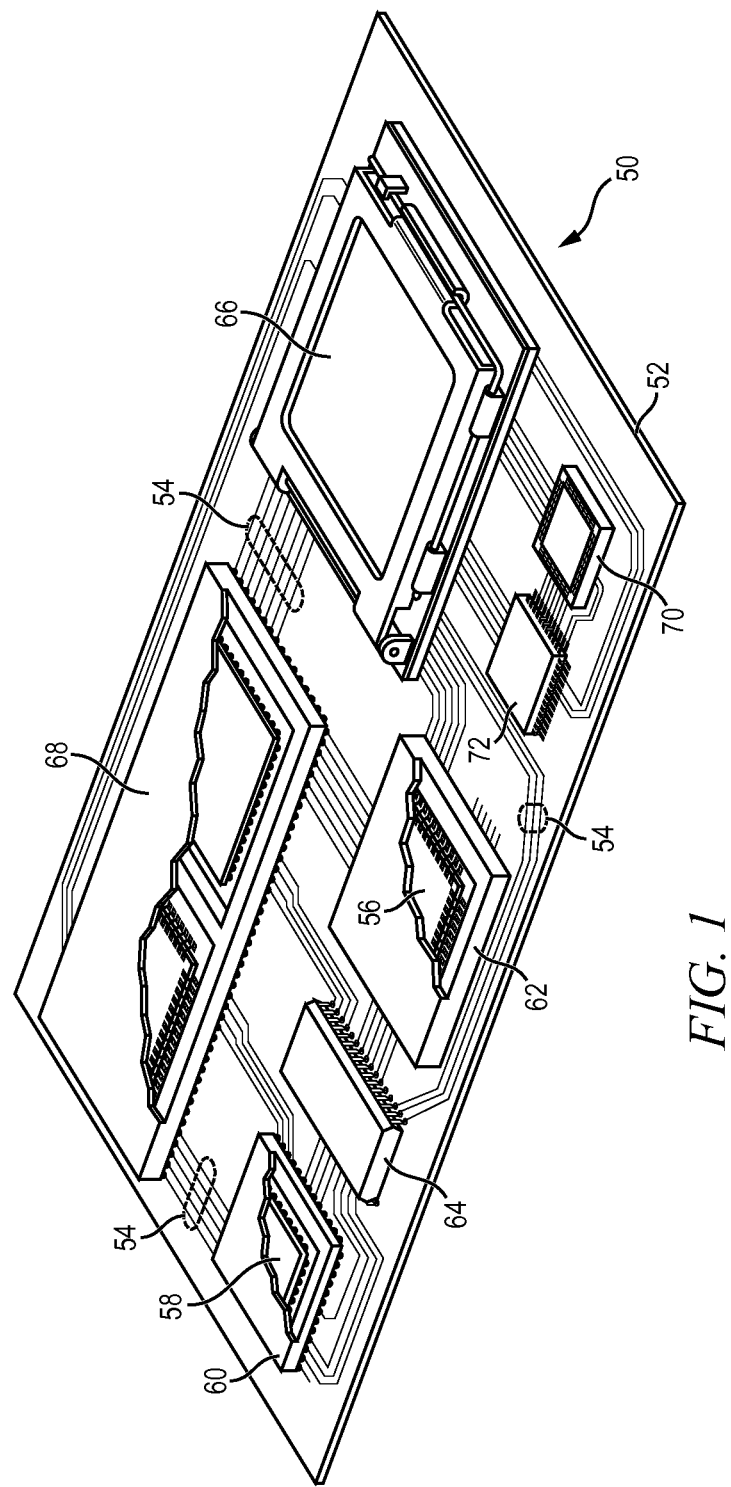
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
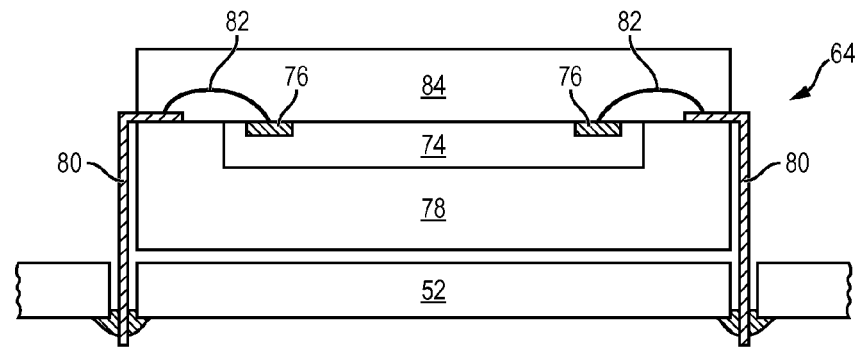
FIGS. 2a-2c illustrate further detail of the representative semiconductor packages mounted to the PCB.
Figure 2B:
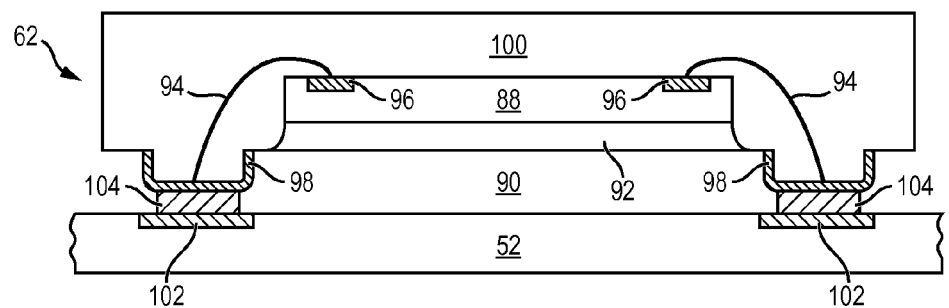
Figure 2C:
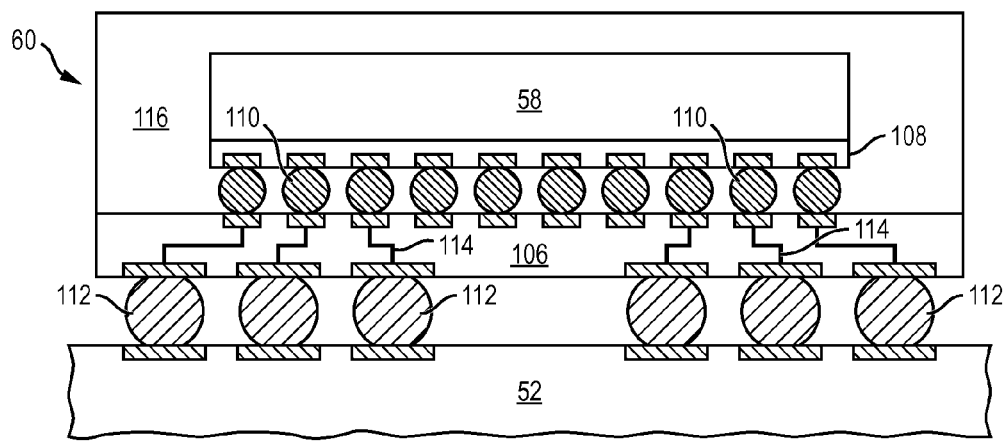

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
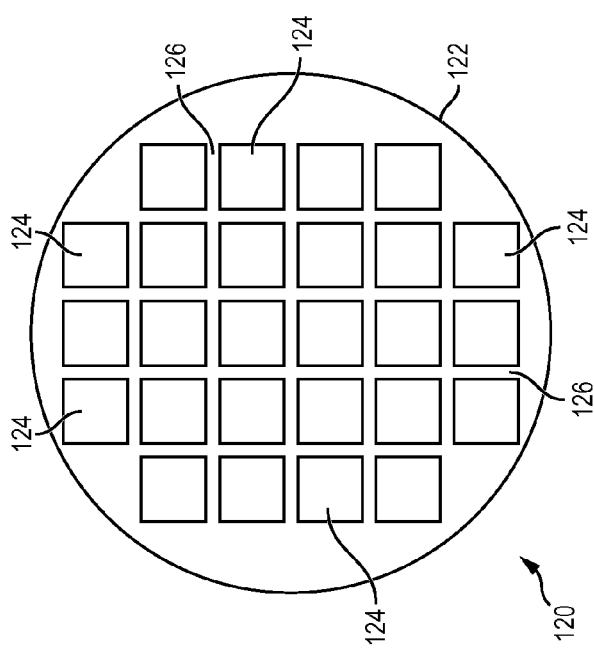

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
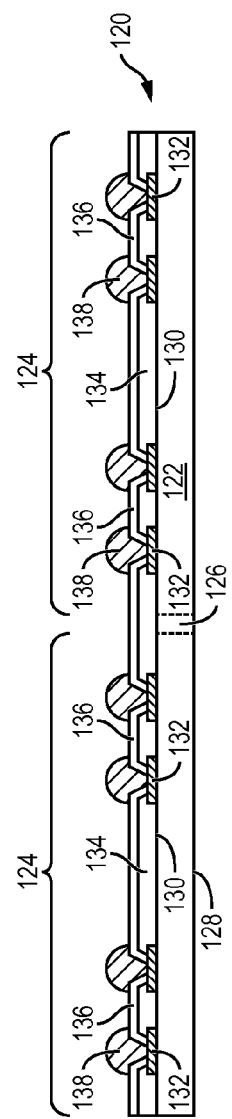

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

An insulating or passivation layer 134 is formed over active surface 130 and conductive layer 132 using PVD, CVD, printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 134 is removed by laser direct ablation (LDA) or an etching process through a patterned photoresist layer to expose conductive layer 132.

An insulating or passivation layer 136 is formed over conductive layer 132 and insulating layer 134 using PVD, CVD, printing, spin coating, spray coating, sintering or thermal oxidation. The insulating layer 136 contains one or more layers of SiO2, Si3N4, SiON, Ta2O5, Al2O3, or other material having similar insulating and structural properties. A portion of insulating layer 136 is removed by LDA or etching process through a patterned photoresist layer to expose conductive layer 132.

An electrically conductive bump material is deposited over conductive layer 132 using an evaporation, electrolytic plating, electroless plating, ball drop, or screen printing process. The bump material can be Al, Sn, Ni, Au, Ag, lead (Pb), Bi, Cu, solder, and combinations thereof, with an optional flux solution. For example, the bump material can be eutectic Sn/Pb, high-lead solder, or lead-free solder. The bump material is bonded to conductive layer 132 using a suitable attachment or bonding process. In one embodiment, the bump material is reflowed by heating the material above its melting point to form balls or bumps 138. In some applications, bumps 138 are reflowed a second time to improve electrical contact to conductive layer 132. In one embodiment, bumps 138 are formed over a UBM having a wetting layer, barrier layer, and adhesive layer. The bumps can also be compression bonded or thermocompression bonded to conductive layer 132. Bumps 138 represent one type of interconnect structure that can be formed over conductive layer 132. The interconnect structure can also use stud bump, micro bump, or other electrical interconnect.

In FIG. 3c, semiconductor wafer 120 is singulated through saw street 126 using a saw blade or laser cutting tool 139 into individual semiconductor die 124.

Figure 4C:
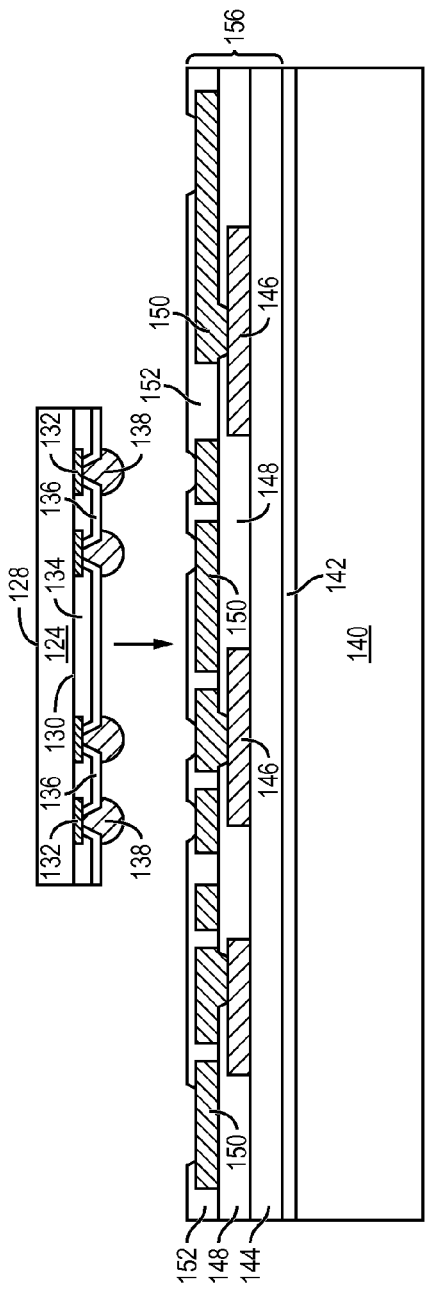
Figure 4D:
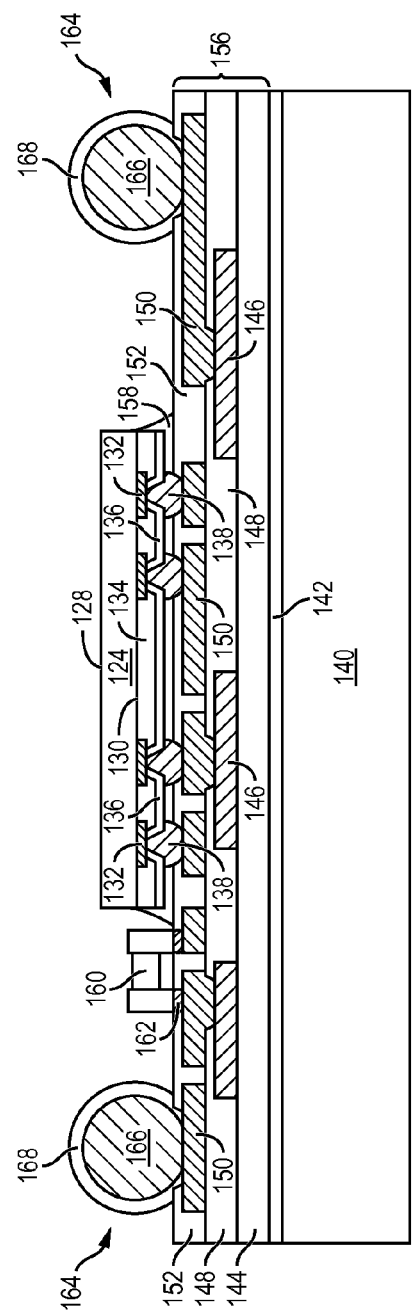

FIGS. 4a-4i illustrate, in relation to FIGS. 1 and 2a-2c, a process of forming top and bottom build-up interconnect structures over carrier for testing at interim stages. FIG. 4a shows a cross-sectional view of a portion of carrier or temporary substrate 140 containing sacrificial or reusable base material such as silicon, polymer, beryllium oxide, glass, or other suitable low-cost, rigid material for structural support. An interface layer or double-sided tape 142 is formed over carrier 140 as a temporary adhesive bonding film, etch-stop layer, or thermal release layer. Carrier 140 can be partially laser grooved for stress relief in subsequent build-up interconnect structure and encapsulation processes. Carrier 140 has sufficient size to accommodate multiple semiconductor die during build-up interconnect formation.

An insulating or passivation layer 144 is formed over interface layer 142 of carrier 140 using PVD, CVD, printing, lamination, spin coating, spray coating, sintering or thermal oxidation. The insulating layer 144 contains one or more layers of SiO2, Si3N4, SiON, Ta2O5, Al2O3, hafnium oxide (HfO2), benzocyclobutene (BCB), polyimide (PI), polybenzoxazoles (PBO), or other material having similar structural and dielectric properties. In one embodiment, insulating layer 144 includes a glass cloth, glass cross, filler, or fiber, such as E-glass cloth, T-glass cloth, Al2O3 or silica filler, for enhanced bending strength.

An electrically conductive layer 146 is formed over insulating layer 144 using a patterning and metal deposition process such as sputtering, electrolytic plating, electroless plating, or Cu foil lamination. Conductive layer 146 can be one or more layers of Al, Cu, Sn, Ni, Au, Ag, or other suitable electrically conductive material. Alternatively, insulating layer 144 and conductive layer 146, with an optional Cu layer formed under insulating layer 144, together provide an RCC tape or pregreg sheet laminated on carrier 140. Conductive layer 146 is patterned with optional etch-thinning process before patterning.

An insulating or passivation layer 148 is formed over insulating layer 144 and conductive layer 146 using PVD, CVD, printing, lamination, spin coating, spray coating, sintering or thermal oxidation. The insulating layer 148 contains one or more layers of SiO2, Si3N4, SiON, Ta2O5, Al2O3, polymer dielectric resist with or without fillers or fibers, or other material having similar insulating and structural properties. A portion of insulating layer 148 is removed by LDA using laser 149 to expose conductive layer 146. Alternatively, a portion of insulating layer 148 is removed by an etching process through a patterned photoresist layer to expose conductive layer 146. In one embodiment, insulating layer 148 includes a glass cloth, glass cross, filler, or fiber, such as E-glass cloth, T-glass cloth, Al2O3 or silica filler, for enhanced bending strength.

In FIG. 4b, an electrically conductive layer or redistribution layer (RDL) 150 is formed over conductive layer 146 and insulating layer 148 using a patterning and metal deposition process such as sputtering, electrolytic plating, and electroless plating. Conductive layer 150 can be one or more layers of Al, Cu, Sn, Ni, Au, Ag, or other suitable electrically conductive material. One portion of conductive layer 150 is electrically connected to conductive layer 146. Other portions of conductive layer 150 can be electrically common or electrically isolated depending on the design and function of semiconductor die 124.

An insulating or passivation layer 152 is formed over insulating layer 148 and conductive layer 150 using PVD, CVD, printing, lamination, spin coating, spray coating, sintering or thermal oxidation. The insulating layer 152 contains one or more layers of SiO2, Si3N4, SiON, Ta2O5, Al2O3, polymer dielectric resist with or without fillers or fibers, or other material having similar insulating and structural properties. A portion of insulating layer 152 is removed by LDA using laser 154 to expose conductive layer 150. Alternatively, a portion of insulating layer 152 is removed by an etching process through a patterned photoresist layer to expose conductive layer 150.

The combination of insulating layers 144, 148, and 152 and conductive layers 146 and 150 constitute a build-up interconnect structure 156. The build-up interconnect structure 156 is inspected and tested to be known good at the wafer level by open/short probe or auto-scope inspection at the present interim stage, i.e., prior to mounting semiconductor die 124. Leakage can be tested at a sampling location.

In FIG. 4c, semiconductor die 124 from FIG. 3c is mounted to build-up interconnect structure 156 using, for example, a pick and place operation with bumps 138 oriented toward the build-up interconnect structure. Bumps 138 are metallurgically and electrically coupled to conductive layer 150. FIG.

4*d* shows semiconductor die 124 mounted to build-up interconnect structure 156 as a reconstituted wafer. Semiconductor die 124 is a KGD having been tested prior to mounting to build-up interconnect structure 156. An underfill material 158, such as an epoxy resin with fillers, is deposited between semiconductor die 124 and build-up interconnect structure 156. Alternatively, underfill may be applied as non-conductive paste (NCP) or non-conductive film (NCF) on semiconductor die 124 before singulation of the die. Discrete semiconductor device 160 is also metallurgically and electrically coupled to conductive layer 150 using conductive paste 162. Discrete semiconductor device 160 can be an inductor, capacitor, resistor, transistor, or diode.

A 3D interconnect structure 164 is formed over conductive layer 150 by ball mounting process with optional solder paste. The 3D interconnect structure 164 includes an inner conductive alloy bump 166, such as Cu or Al, and protective layer 168, such as solder alloy SAC305, Cu, polymer, or plastic. Alternatively, an electrically conductive bump material is deposited over conductive layer 150 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 150 using a suitable attachment or bonding process. In one embodiment, the bump material is reflowed by heating the material above its melting point to form balls or bumps. In some applications, the bumps are reflowed a second time to improve electrical contact to conductive layer 150. The bumps can also be compression bonded or thermocompression bonded to conductive layer 150.

In FIG. 4*e*, an encapsulant or molding compound 170 is deposited over semiconductor die 124, build-up interconnect structure 156, and 3D interconnect structure 164 using a paste printing, compressive molding, transfer molding, liquid encapsulant molding, vacuum lamination, spin coating, or other suitable applicator. Encapsulant 170 can be polymer composite material, such as epoxy resin with filler, epoxy acrylate with filler, or polymer with proper filler. Encapsulant 170 is non-conductive and environmentally protects the semiconductor device from external elements and contaminants.

In FIG. 4*f*, a portion of encapsulant 170 in removed in a grinding operation with grinder 172 to planarize the surface and reduce a thickness of the encapsulant and to expose inner conductive bump 166. A chemical etch or CMP process can also be used to remove mechanical damage resulting from the grinding operation and planarize encapsulant 170. FIG. 4*g* shows the assembly after the grinding operation. Back surface 128 of semiconductor die 124 remains covered by encapsulant 170 after the grinding operation. Alternatively, a portion of encapsulant 170 in removed by LDA or drilling to expose inner conductive bump 166.

In FIG. 4*h*, an optional insulating or passivation layer 178 is formed over encapsulant 170 and 3D interconnect structure 164 using PVD, CVD, printing, lamination, spin coating, spray coating, sintering or thermal oxidation. The insulating layer 178 contains one or more layers of SiO2, Si3N4, SiON, Ta2O5, Al2O3, polymer dielectric resist with or without fillers or fibers, or other material having similar insulating and structural properties. A portion of insulating layer 178 is removed by LDA or etching process through a patterned photoresist layer to expose inner conductive bump 166.

An electrically conductive layer or RDL 180 is formed over insulating layer 178 and inner conductive bump 166 using a patterning and metal deposition process such as sputtering, electrolytic plating, and electroless plating. Conductive layer 180 can be one or more layers of Al, Cu, Sn, Ni, Au, Ag, or other suitable electrically conductive material. One portion of conductive layer 180 is electrically connected to inner conductive bump 166. Other portions of conductive layer 180 can be electrically common or electrically isolated depending on the design and function of semiconductor die 124.

An insulating or passivation layer 182 is formed over insulating layer 178 and conductive layer 180 using PVD, CVD, printing, lamination, spin coating, spray coating, sintering or thermal oxidation. The insulating layer 182 contains one or more layers of SiO2, Si3N4, SiON, Ta2O5, Al2O3, polymer dielectric resist with or without fillers or fibers, or other material having similar insulating and structural properties. In one embodiment, insulating layer 182 includes an embedded glass cloth, glass cross, filler, or fiber, such as E-glass cloth, T-glass cloth, Al2O3 or silica filler, for enhanced bending strength. A portion of insulating layer 182 is removed by LDA using laser 184 to expose conductive layer 180. Alternatively, a portion of insulating layer 182 is removed by an etching process through a patterned photoresist layer to expose conductive layer 180.

The combination of insulating layers 178 and 182 and conductive layer 180 constitute a build-up interconnect structure 186. The build-up interconnect structures 186 is formed over carrier 140 but at a different time than build-up interconnect structure 156, i.e., after depositing encapsulant 170. The build-up interconnect structure 186 is inspected and tested to be known good at an interim stage, i.e., prior to additional device integration, see FIG. 10.

In FIG. 4*i*, carrier 140 and interface layer 142 are removed by chemical etching, mechanical peeling, chemical mechanical planarization (CMP), mechanical grinding, thermal release, UV light, laser scanning, or wet stripping to expose insulating layer 144. A backgrinding tape or support carrier can be applied to insulating layer 182 prior to removing carrier 140. A portion of insulating layer 144 is removed by LDA or etching process through a patterned photoresist layer to expose conductive layer 146.

An electrically conductive bump material is deposited over conductive layer 146 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 146 using a suitable attachment or bonding process. In one embodiment, the bump material is reflowed by heating the material above its melting point to form balls or bumps 188. In some applications, bumps 188 are reflowed a second time to improve electrical contact to conductive layer 146. In one embodiment, bumps 188 are formed over a UBM having a wetting layer, barrier layer, and adhesive layer. The bumps can also be compression bonded or thermocompression bonded to conductive layer 146. Bumps 188 represent one type of interconnect structure that can be formed over conductive layer 146. The interconnect structure can also use bond wires, conductive paste, stud bump, micro bump, or other electrical interconnect.

The reconstituted wafer or panel is singulated into individual Fo-WLCSP 190 units. Semiconductor die 124 embedded in Fo-WLCSP 190 is electrically connected through bumps 138 to build-up interconnect structure 156 and bumps 188. The build-up interconnect structure 156 is inspected and tested to be known good by open/short probe or auto-scope inspection at an interim stage, i.e., prior to mounting semiconductor die 124. Semiconductor die 124 is further electrically connected through inner conductive bump 166 to build-up interconnect structure 186. The build-up interconnect structures 156 and 186 are formed over carrier 140 at different times with respect to opposite surfaces of encapsulant 170. The build-up interconnect structures 186 is inspected and tested to be known good before additional device integration.

FIG. 5 shows an embodiment of Fo-WLCSP 200, similar to FIG. 4i, with embedded semiconductor die 124 and stud bumps 202 disposed within encapsulant 170 for vertical interconnect between build-up interconnect structure 156 and build-up interconnect structure 186.

FIGS. 6a-6f illustrate another embodiment, continuing from FIG. 4b, including semiconductor die 204 as singulated from a semiconductor wafer similar to FIG. 3a and having a back surface 208 and active surface 210 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 210 to implement analog circuits or digital circuits, such as DSP, ASIC, memory, or other signal processing circuit. Semiconductor die 204 may also contain IPDs, such as inductors, capacitors, and resistors, for RF signal processing.

Figure 6A:
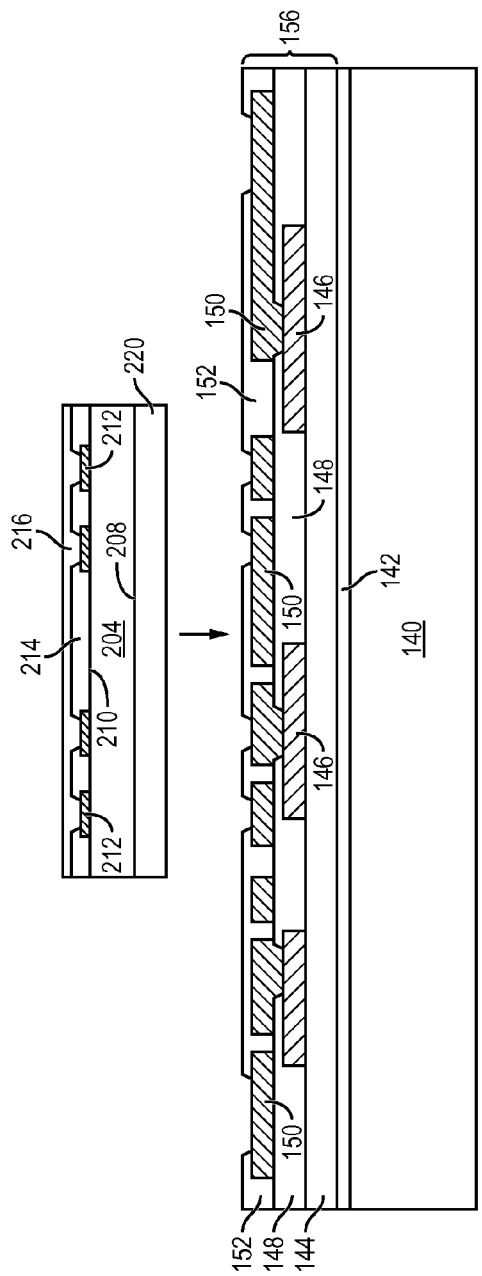

In FIG. 6a, an electrically conductive layer 212 is formed over active surface 210 using PVD, CVD, electrolytic plating, electroless plating process, or other suitable metal deposition process. Conductive layer 212 can be one or more layers of Al, Cu, Sn, Ni, Au, Ag, or other suitable electrically conductive material. Conductive layer 212 operates as contact pads electrically connected to the circuits on active surface 210.

An insulating or passivation layer 214 is formed over active surface 210 and conductive layer 212 using PVD, CVD, printing, lamination, spin coating, spray coating, sintering or thermal oxidation. The insulating layer 214 contains one or more layers of SiO2, Si3N4, SiON, Ta2O5, Al2O3, or other material having similar insulating and structural properties. A portion of insulating layer 214 is removed by LDA to expose conductive layer 212.

An insulating or passivation layer 216 is formed over insulating layer 214 and conductive layer 212 using PVD, CVD, printing, lamination, spin coating, spray coating, sintering or thermal oxidation. The insulating layer 216 contains one or more layers of SiO2, Si3N4, SiON, Ta2O5, Al2O3, or other material having similar insulating and structural properties. The insulating layer 216 protects semiconductor die 204. Alternatively, insulating layers 214 and 216 can be the same layer with thickness greater than 15 micrometers (μm).

Figure 6B:
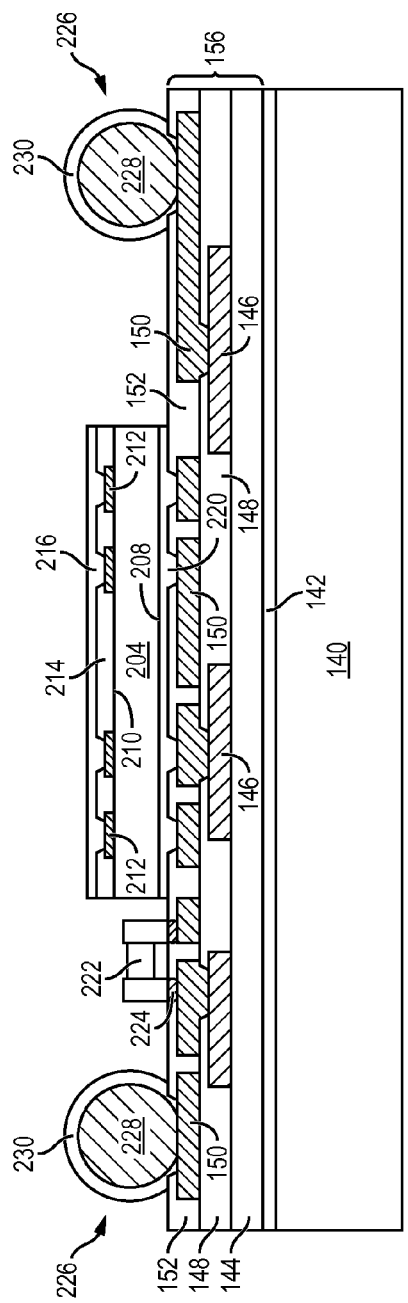

Semiconductor die 204 with die attach film (DAF) 220 is mounted to build-up interconnect structure 156 using a pick and place operation with back surface 208 oriented toward the build-up interconnect structure. FIG. 6b shows semiconductor die 204 mounted to build-up interconnect structure 156 with DAF 220 as a reconstituted wafer. Semiconductor die 204 is a KGD having been tested prior to mounting to build-up interconnect structure 156. Discrete semiconductor device 222 is also metallurgically and electrically coupled to conductive layer 150 using conductive paste 224. Discrete semiconductor device 222 can be an inductor, capacitor, resistor, transistor, or diode.

A 3D interconnect structure 226 is formed over conductive layer 150. The 3D interconnect structure 226 includes an inner conductive alloy bump 228, such as Cu or Al, and protective layer 230, such as solder alloy SAC305, Cu, polymer, or plastic. Alternatively, an electrically conductive bump material is deposited over conductive layer 150 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 150 using a suitable attachment or bonding process. In one embodiment, the bump material is reflowed by heating the material above its melting point to form balls or bumps. In some applications, the bumps are reflowed a second time to improve electrical contact to conductive layer 150. The bumps can also be compression bonded or thermocompression bonded to conductive layer 150.

In FIG. 6c, an encapsulant or molding compound 234 is deposited over semiconductor die 204, build-up interconnect structure 156, and 3D interconnect structure 226 using a paste printing, compressive molding, transfer molding, liquid encapsulant molding, vacuum lamination, spin coating, or other suitable applicator. Encapsulant 234 can be polymer composite material, such as epoxy resin with filler, epoxy acrylate with filler, or polymer with proper filler. Encapsulant 234 is non-conductive and environmentally protects the semiconductor device from external elements and contaminants.

In FIG. 6d, a portion of encapsulant 234 is removed in a grinding operation with grinder 236 to planarize the surface and reduce a thickness of the encapsulant and to expose insulating layer 216 and inner conductive bump 228. A chemical etch or CMP process can also be used to remove mechanical damage resulting from the grinding operation and planarize encapsulant 234. Alternatively, a portion of encapsulant 234 in removed by LDA or drilling to expose inner conductive bump 228. The insulating layer 216 is stripped by wet chemical stripping or LDA to expose conductive layer 212.

Figure 6E:
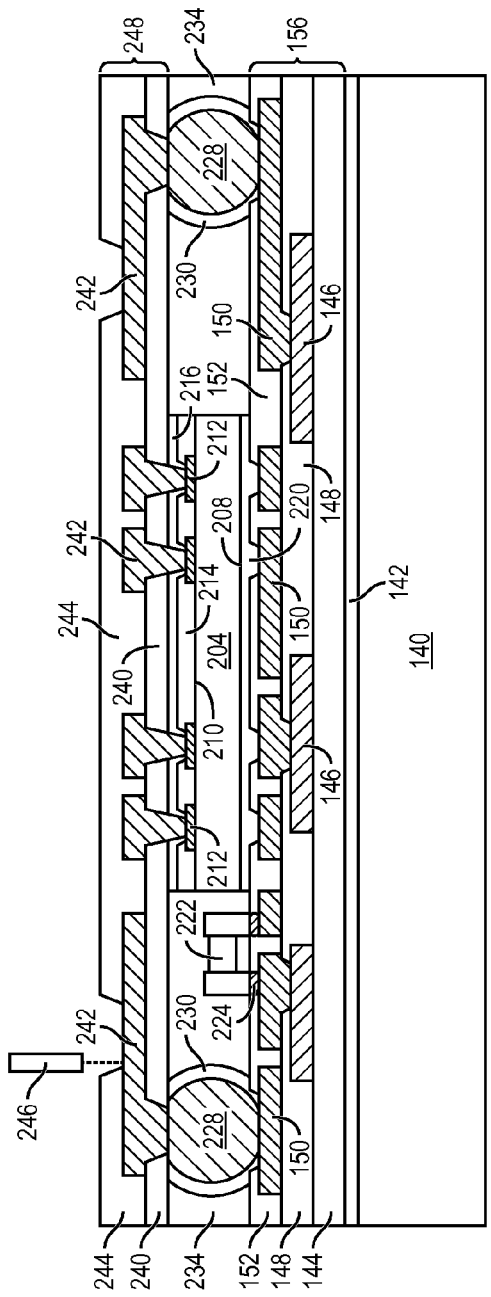

In FIG. 6e, an insulating or passivation layer 240 is formed over encapsulant 234 and 3D interconnect structure 226 using PVD, CVD, printing, lamination, spin coating, spray coating, sintering or thermal oxidation. The insulating layer 240 contains one or more layers of SiO2, Si3N4, SiON, Ta2O5, Al2O3, polymer dielectric resist with or without fillers or fibers, or other material having similar insulating and structural properties. A portion of insulating layers 216 and 240 is removed by LDA or etching process through a patterned photoresist layer to expose conductive layer 212 and inner conductive bump 228.

An electrically conductive layer or RDL 242 is formed over insulating layer 240 and inner conductive bump 228 using a patterning and metal deposition process such as sputtering, electrolytic plating, and electroless plating. Conductive layer 242 can be one or more layers of Al, Cu, Sn, Ni, Au, Ag, or other suitable electrically conductive material. One portion of conductive layer 242 is electrically connected to inner conductive bump 228. Another portion of conductive layer 242 is electrically connected to conductive layer 212. Other portions of conductive layer 242 can be electrically common or electrically isolated depending on the design and function of semiconductor die 204.

An insulating or passivation layer 244 is formed over insulating layer 240 and conductive layer 242 using PVD, CVD, printing, lamination, spin coating, spray coating, sintering or thermal oxidation. The insulating layer 244 contains one or more layers of SiO2, Si3N4, SiON, Ta2O5, Al2O3, or other material having similar insulating and structural properties. In one embodiment, insulating layer 244 includes an embedded glass cloth, glass cross, filler, or fiber for enhanced bending strength. A portion of insulating layer 244 is removed by LDA using laser 246 to expose conductive layer 242. Alternatively, a portion of insulating layer 244 is removed by an etching process through a patterned photoresist layer to expose conductive layer 242.

The combination of insulating layers 240 and 244 and conductive layer 242 constitute a build-up interconnect structure 248. The build-up interconnect structures 248 is formed over carrier 140 but at a different time than build-up interconnect structure 156, i.e., after depositing encapsulant 234. The build-up interconnect structure 248 is inspected and tested to be known good at an interim stage, i.e., prior to additional device integration, see FIG. 10.

Figure 6F:
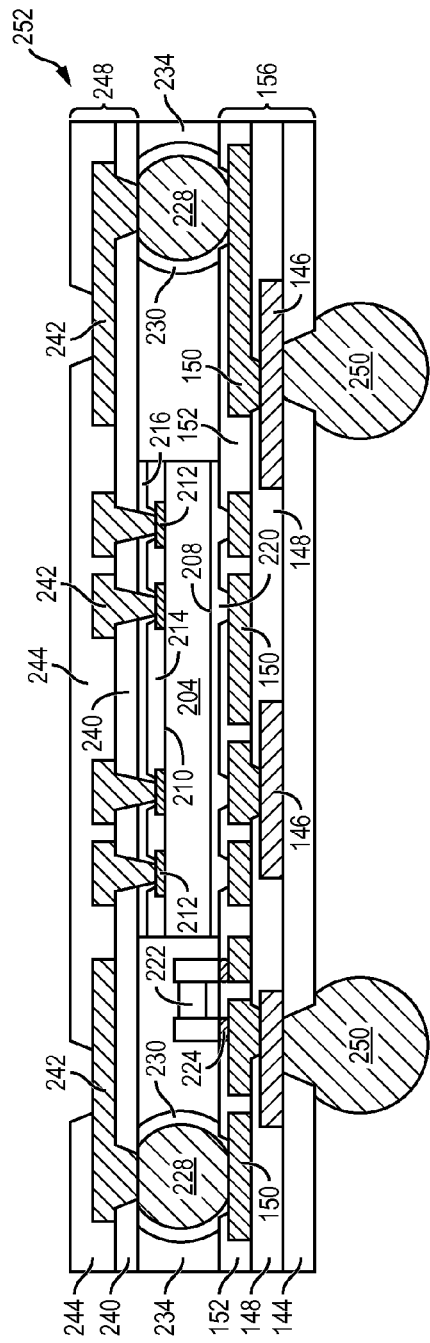

In FIG. 6f, carrier 140 and interface layer 142 are removed by chemical etching, mechanical peeling, CMP, mechanical grinding, thermal release, UV light, laser scanning, or wet stripping to expose insulating layer 144. A backgrinding tape or support carrier can be applied to insulating layer 244 prior to removing carrier 140. A portion of insulating layer 144 is removed by LDA or etching process through a patterned photoresist layer to expose conductive layer 146.

An electrically conductive bump material is deposited over conductive layer 146 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 146 using a suitable attachment or bonding process. In one embodiment, the bump material is reflowed by heating the material above its melting point to form balls or bumps 250. In some applications, bumps 250 are reflowed a second time to improve electrical contact to conductive layer 146. In one embodiment, bumps 250 are formed over a UBM having a wetting layer, barrier layer, and adhesive layer. The bumps can also be compression bonded or thermocompression bonded to conductive layer 146. Bumps 250 represent one type of interconnect structure that can be formed over conductive layer 146. The interconnect structure can also use bond wires, conductive paste, stud bump, micro bump, or other electrical interconnect.

The reconstituted wafer or panel is singulated into individual Fo-WLCSP 252 units. Semiconductor die 204 embedded in Fo-WLCSP 252 is electrically connected to build-up interconnect structure 248. The build-up interconnect structures 248 are inspected and tested to be known good before additional device integration. Semiconductor die 204 is further electrically connected through inner conductive bump 228 to build-up interconnect structure 156. The build-up interconnect structures 156 and 248 are formed over carrier 140 at different times with respect to opposite surfaces of encapsulant 234. The build-up interconnect structure 156 is inspected and tested to be known good by open/short probe or auto-scope inspection at an interim stage, i.e., prior to mounting semiconductor die 204.

Figure 7A:
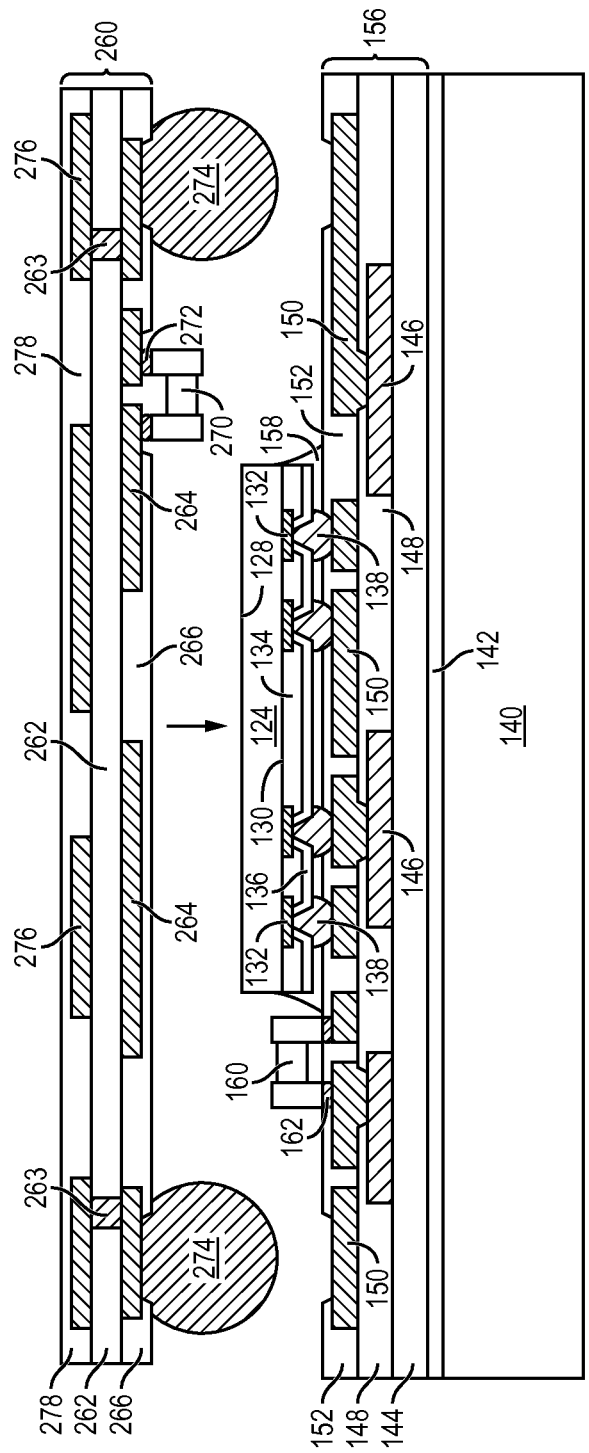

FIGS. 7a-7d illustrate another embodiment, continuing from FIG. 4c, build-up interconnect structure 260 includes a core laminate substrate 262. In FIG. 7a, a plurality of through hole vias is formed through substrate 262 using laser drilling, mechanical drilling, or deep reactive ion etching (DRIE). The vias are filled with Al, Cu, Sn, Ni, Au, Ag, titanium (Ti), tungsten (W), or other suitable electrically conductive material using electrolytic plating, electroless plating process, or other suitable deposition process to form conductive vias 263. Alternatively, Cu is deposited on the sidewalls of the through hole vias by electroless and electrolytic Cu plating, and the vias are filled with Cu paste or resin having fillers.

An electrically conductive layer or RDL 264 is formed over substrate 262 and conductive vias 263 using a patterning and metal deposition process such as sputtering, electrolytic plating, and electroless plating. Conductive layer 264 can be one or more layers of Al, Cu, Sn, Ni, Au, Ag, or other suitable electrically conductive material. One portion of conductive layer 264 is electrically connected to conductive vias 263. Other portions of conductive layer 264 can be electrically common or electrically isolated depending on the design and function of semiconductor die 124 or 204.

An insulating or passivation layer 266 is formed over substrate 262 and conductive layer 264 using PVD, CVD, printing, lamination, spin coating, spray coating, sintering or thermal oxidation. The insulating layer 266 contains one or more layers of SiO2, Si3N4, SiON, Ta2O5, Al2O3, polymer dielectric resist with or without fillers or fibers, or other material having similar insulating and structural properties. A portion of insulating layer 266 is removed by LDA or etching process through a patterned photoresist layer to expose conductive layer 264. Discrete semiconductor device 270 is metallurgically and electrically coupled to conductive layer 264 using conductive paste 272. Discrete semiconductor device 270 can be an inductor, capacitor, resistor, transistor, or diode.

An electrically conductive layer or RDL 276 is formed over substrate 262 and conductive vias 263 using a patterning and metal deposition process such as sputtering, electrolytic plating, and electroless plating. Conductive layer 276 can be one or more layers of Al, Cu, Sn, Ni, Au, Ag, or other suitable electrically conductive material. One portion of conductive layer 276 is electrically connected to conductive vias 263. Other portions of conductive layer 276 can be electrically common or electrically isolated depending on the design and function of semiconductor die 204.

An insulating or passivation layer 278 is formed over substrate 262 and conductive layer 276 using PVD, CVD, printing, lamination, spin coating, spray coating, sintering or thermal oxidation. The insulating layer 278 contains one or more layers of SiO2, Si3N4, SiON, Ta2O5, Al2O3, polymer dielectric resist with/without fillers or fibers or other material having similar insulating and structural properties.

An electrically conductive bump material is deposited over conductive layer 264 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 264 using a suitable attachment or bonding process. In one embodiment, the bump material is reflowed by heating the material above its melting point to form balls or bumps 274. In some applications, bumps 274 are reflowed a second time to improve electrical contact to conductive layer 264. In one embodiment, bumps 274 are formed over a UBM having a wetting layer, barrier layer, and adhesive layer. The bumps can also be compression bonded or thermocompression bonded to conductive layer 264. Bumps 274 represent one type of interconnect structure that can be formed over conductive layer 264. The interconnect structure can also use bond wires, conductive paste, stud bump, micro bump, or other electrical interconnect.

Discrete semiconductor device 270 is metallurgically and electrically coupled to conductive layer 264 using conductive paste 272. Discrete semiconductor device 270 can be an inductor, capacitor, resistor, transistor, or diode.

Figure 7B:
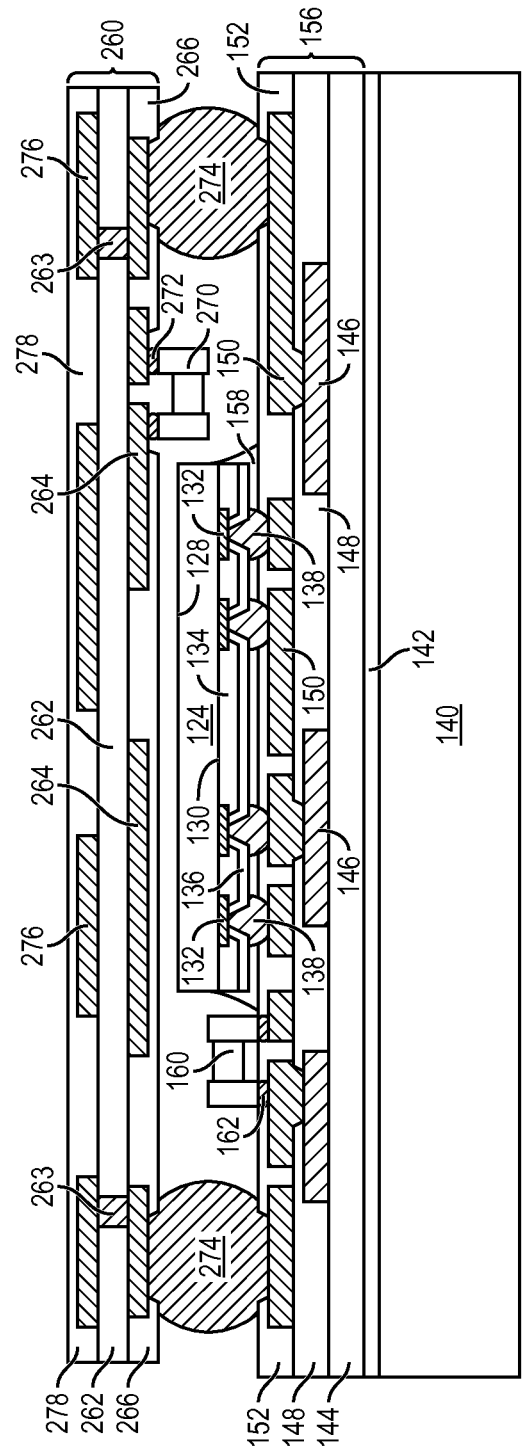

Build-up interconnect structure 260 with core substrate 262 is mounted to build-up interconnect structure 156, in a reconstituted wafer or panel form, using a pick and place operation with bumps 274 oriented toward build-up interconnect structure 156. FIG. 7b shows build-up interconnect structure 260 with core substrate 262 mounted to build-up interconnect structure 156 with bumps 274 bonded to conductive layer 150.

Figure 7C:
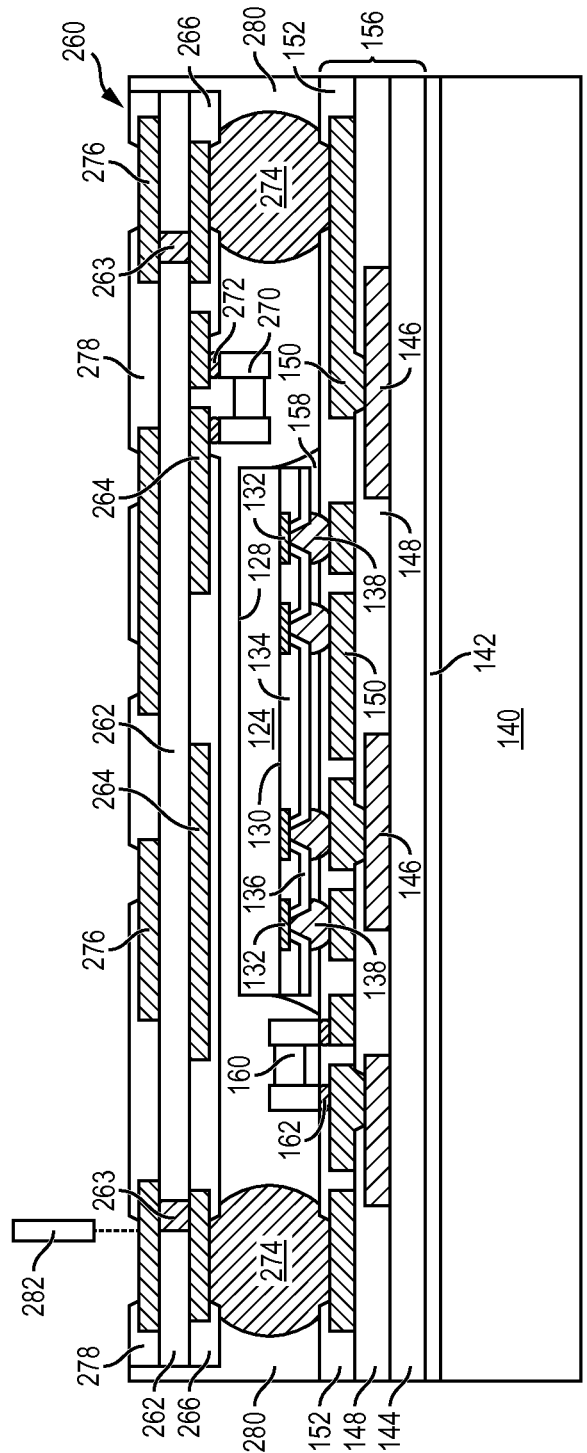

In FIG. 7c, an encapsulant or molding compound 280 is deposited over semiconductor die 124 and around bumps 274 between build-up interconnect structures 156 and 260 using a paste printing, with vacuum and high pressure curing, compressive molding, transfer molding, liquid encapsulant molding, vacuum lamination, spin coating, or other suitable applicator. Encapsulant 280 can be polymer composite material, such as epoxy resin with filler, epoxy acrylate with filler, or polymer with proper filler. Encapsulant 280 is non-conductive and environmentally protects the semiconductor device from external elements and contaminants. Encapsulant 280 may be overmolded or overflow on the surface of insulating layer 278.

A portion of insulating layer 278 and the optional overmold portion of encapsulant 280 is removed by LDA using laser 282 to expose conductive layer 276. Alternatively, a portion of insulating layer 278 is removed by an etching process through a patterned photoresist layer to expose conductive layer 276.

In FIG. 7d, carrier 140 and optional interface layer 142 are removed by chemical etching, mechanical peeling, CMP, mechanical grinding, thermal release, UV light, laser scanning, or wet stripping to expose insulating layer 144. A backgrinding tape or support carrier can be applied to insulating layer 244 prior to removing carrier 140. A portion of insulating layer 144 is removed by LDA or etching process through a patterned photoresist layer to expose conductive layer 146.

An electrically conductive bump material is deposited over conductive layer 146 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 146 using a suitable attachment or bonding process. In one embodiment, the bump material is reflowed by heating the material above its melting point to form balls or bumps 284. In some applications, bumps 284 are reflowed a second time to improve electrical contact to conductive layer 146. In one embodiment, bumps 284 are formed over a UBM having a wetting layer, barrier layer, and adhesive layer. The bumps can also be compression bonded or thermocompression bonded to conductive layer 146. Bumps 284 represent one type of interconnect structure that can be formed over conductive layer 146. The interconnect structure can also use bond wires, conductive paste, stud bump, micro bump, or other electrical interconnect.

The reconstituted wafer or panel is singulated into individual Fo-WLCSP 286 units. Semiconductor die 124 embedded in Fo-WLCSP 286 is electrically connected through bumps 138 to build-up interconnect structure 156 and bumps 284. The build-up interconnect structure 156 is inspected and tested to be known good by open/short probe or auto-scope inspection at an interim stage, i.e., prior to mounting semiconductor die 124. Semiconductor die 124 is further electrically connected through bumps 274 to build-up interconnect structure 260. The build-up interconnect structures 156 and 260 are formed at different times with respect to opposite surfaces of encapsulant 280. The build-up interconnect structures 260 are inspected and tested to be known good before additional device integration.

FIG. 8 shows an embodiment of Fo-WLCSP 290, similar to FIG. 7d, with embedded semiconductor die 124 mounted to build-up interconnect structure 260.

FIGS. 9a-9b show an embodiment of Fo-WLCSP 300, similar to FIG. 7d, with build-up interconnect structure 156 formed over carrier or temporary substrate 301 containing sacrificial or reusable base material such as silicon, polymer, beryllium oxide, glass, or other suitable low-cost, rigid material for structural support. A build-up interconnect structure 302, including insulating layer 304, conductive layer 306, insulating layer 308, conductive layer 310, and insulating layer 312, are formed over carrier or temporary substrate 314 containing sacrificial or reusable base material such as silicon, polymer, beryllium oxide, glass, or other suitable low-cost, rigid material for structural support. In one embodiment, insulating layer 312 includes an embedded glass cloth, glass cross, filler, or fiber, such as E-glass cloth, T-glass cloth, Al2O3 or silica filler, for enhanced bending strength. Discrete semiconductor device 316 is metallurgically and electrically coupled to conductive layer 306 using conductive paste 318. Discrete semiconductor device 316 can be an inductor, capacitor, resistor, transistor, or diode.

In FIG. 9a, an electrically conductive bump material is deposited over conductive layer 306 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 306 using a suitable attachment or bonding process. In one embodiment, the bump material is reflowed by heating the material above its melting point to form balls or bumps 320. In some applications, bumps 320 are reflowed a second time to improve electrical contact to conductive layer 306. In one embodiment, bumps 320 are formed over a UBM having a wetting layer, barrier layer, and adhesive layer. The bumps can also be compression bonded or thermocompression bonded to conductive layer 306. Bumps 320 represent one type of interconnect structure that can be formed over conductive layer 306. The interconnect structure can also use stud bump, micro bump, or other electrical interconnect.

Build-up interconnect structure 302 is mounted to build-up interconnect structure 156, in a reconstituted wafer or panel form, using a pick and place operation with bumps 320 oriented toward build-up interconnect structure 156. FIG. 9b shows build-up interconnect structure 260 mounted to build-up interconnect structure 156 with bumps 320 bonded to conductive layer 150. An encapsulant or molding compound 322 is deposited over semiconductor die 124 and around bumps 320 between build-up interconnect structures 156 and 302 using a paste printing, compressive molding, transfer molding, liquid encapsulant molding, vacuum lamination, spin coating, or other suitable applicator. Encapsulant 322 can be polymer composite material, such as epoxy resin with filler, epoxy acrylate with filler, or polymer with proper filler. Encapsulant 322 is non-conductive and environmentally protects the semiconductor device from external elements and contaminants.

Carrier 314 is removed by chemical etching, mechanical peeling, CMP, mechanical grinding, thermal release, UV light, laser scanning, or wet stripping. A portion of insulating layer 312 is removed by LDA or etching process through a patterned photoresist layer to expose conductive layer 310.

Carrier 301 is removed by chemical etching, mechanical peeling, CMP, mechanical grinding, thermal release, UV light, laser scanning, or wet stripping. An electrically conductive bump material is deposited over conductive layer 146 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 146 using a suitable attachment or bonding process. In one embodiment, the bump material is reflowed by heating the material above its melting point to form balls or bumps 324. In some applications, bumps 324 are reflowed a second time to improve electrical contact to conductive layer 146. In one embodiment, bumps 324 are formed over a UBM having a wetting layer, barrier layer, and adhesive layer. The bumps can also be compression bonded or thermocompression bonded to conductive layer 146. Bumps 324 represent one type of interconnect structure that can be formed over conductive layer 146. The interconnect structure can also use bond wires, conductive paste, stud bump, micro bump, or other electrical interconnect.

The reconstituted wafer or panel is singulated into individual Fo-WLCSP 300 units. Semiconductor die 124 embedded in Fo-WLCSP 300 is electrically connected through bumps 138 to build-up interconnect structure 156 and bumps 324. The build-up interconnect structure 156 is inspected and tested to be known good by open/short probe or auto-scope inspection at an interim stage, i.e., prior to mounting semiconductor die 124. Semiconductor die 124 is further electrically connected through bumps 320 to build-up interconnect structure 302. The build-up interconnect structures 156 and 302 are formed at different times with respect to opposite surfaces of encapsulant 322. The build-up interconnect structures 302 are inspected and tested to be known good before additional device integration.

Figure 10:
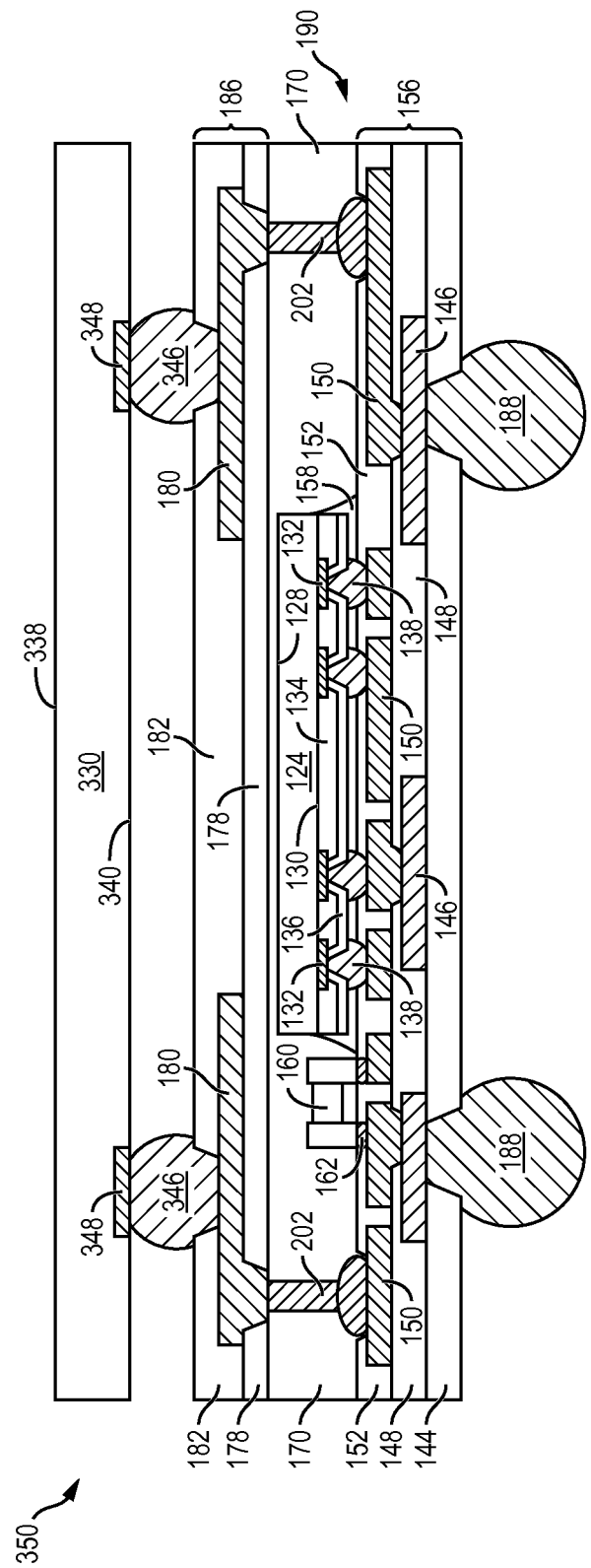
FIG. 10 illustrates PoP including the Fo-WLCSP with bumps disposed between the top and bottom build-up interconnect structures.

FIG. 10 illustrates a PoP arrangement with semiconductor die 330 as singulated from a semiconductor wafer similar to FIG. 3a and having a back surface 338 and active surface 340 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 340 to implement analog circuits or digital circuits, such as DSP, ASIC, memory, or other signal processing circuit. Semiconductor die 330 may also contain IPDs, such as inductors, capacitors, and resistors, for RF signal processing.

A plurality of bumps 346 is formed on contact pads 348 of semiconductor die 330. Semiconductor die 330 is mounted to Fo-WLCSP 190 with bumps 346 metallurgically and electrically connected to conductive layer 180 as PoP 350.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a first interconnect structure by,
        (a) providing a first insulating layer, and
        (b) forming a first conductive layer over the first insulating layer;
    testing the first interconnect structure at a wafer-level;
    after testing the first interconnect structure, disposing a semiconductor die over the first interconnect structure at the same wafer-level as the testing of the first interconnect structure;
    forming a vertical interconnect structure over the first interconnect structure, the vertical interconnect structure including an inner conductive bump in contact with the first interconnect structure and protective layer disposed over the inner conductive bump;
    depositing an encapsulant over the semiconductor die, first interconnect structure, and vertical interconnect structure;
    removing a portion of the encapsulant and a portion of the protective layer to expose the inner conductive bump;
    forming a second interconnect structure over the encapsulant; and
    removing a portion of the first insulating layer after forming the second interconnect structure.

2. The method of claim 1, further including disposing a discrete semiconductor device over the first interconnect structure or the second interconnect structure.

3. The method of claim 1, wherein the first insulating layer includes an embedded glass cloth, glass cross, filler, or fiber.

4. The method of claim 1, further including testing the second interconnect structure.

5. The method of claim 1, further including forming the second interconnect structure including a second insulating layer comprising an embedded glass cloth, glass cross, filler, or fiber.

6. The method of claim 1, wherein forming the second interconnect structure further includes:
    providing a second insulating layer in contact with the encapsulant; and
    forming a second conductive layer over the insulating layer.

7. A method of making a semiconductor device, comprising:
    providing a first interconnect structure;
    testing the first interconnect structure at a wafer-level;
    after testing the first interconnect structure, disposing a semiconductor die over the first interconnect structure at the same wafer-level as the testing of the first interconnect structure;
    forming a vertical interconnect structure over the first interconnect structure with a protective layer disposed over the vertical interconnect structure;
    depositing an encapsulant over the semiconductor die and first interconnect structure;
    removing a portion of the encapsulant and a portion of the protective layer to expose the vertical interconnect structure; and
    forming a second interconnect structure over the semiconductor die.

8. The method of claim 7, wherein the semiconductor die is a known good die.

9. The method of claim 7, further including disposing a discrete semiconductor device over the first interconnect structure or the second interconnect structure.

10. The method of claim 7, wherein the first interconnect structure or second interconnect structure includes an insulating layer comprising an embedded glass cloth, glass cross, filler, or fiber.

11. The method of claim 7, wherein the vertical interconnect structure includes a bump or stud bump.

12. The method of claim 7, wherein providing the first interconnect structure further includes:
    providing an insulating layer; and
    forming a conductive layer over the insulating layer.

13. The method of claim 12, further including removing a portion of the insulating layer after forming the second interconnect structure.

14. The method of claim 7, wherein forming the second interconnect structure further includes:

providing an insulating layer in contact with the encapsulant; and forming a conductive layer over the insulating layer.

15. The method of claim 14, wherein the conductive layer contacts the vertical interconnect structure.

16. A method of making a semiconductor device, comprising:

providing a first interconnect structure testable during interim stages of making the semiconductor device;

forming a vertical interconnect structure over the first interconnect structure with a protective layer disposed over the vertical interconnect structure;

providing a second interconnect structure;

testing the second interconnect structure at a wafer-level;

disposing the first interconnect structure over the second interconnect structure to bring the vertical interconnect structure into contact with the second interconnect structure;

disposing a first semiconductor die over the first interconnect structure or second interconnect structure; and cutting through the second interconnect structure to singulate the semiconductor device.

17. The method of claim 16, further including disposing a discrete semiconductor device over the first interconnect structure or the second interconnect structure.

18. The method of claim 16, further including testing the first interconnect structure.

19. The method of claim 16, further including disposing a second semiconductor die over the second interconnect structure.

20. The method of claim 16, wherein the vertical interconnect structure includes a bump or stud bump.

21. The method of claim 16, wherein the first interconnect structure or second interconnect structure includes an insulating layer comprising an embedded glass cloth, glass cross, filler, or fiber.

22. The method of claim 16, wherein forming the second interconnect structure further includes:

providing an insulating layer; and forming a conductive layer over the insulating layer.

23. The method of claim 22, wherein the conductive layer contacts the vertical interconnect structure.

24. A method of making a semiconductor device, comprising:

providing a first interconnect structure;

testing the first interconnect structure at a wafer-level;

after testing the first interconnect structure, disposing a semiconductor die over the first interconnect structure at the same wafer-level as the testing of the first interconnect structure;

forming a vertical interconnect structure over the first interconnect structure with a protective layer disposed over the vertical interconnect structure;

depositing an encapsulant over the semiconductor die and first interconnect structure; and removing a portion of the encapsulant and a portion of the protective layer to expose the vertical interconnect structure.

25. The method of claim 24, further including forming a second interconnect structure over the semiconductor die and encapsulant.

26. The method of claim 24, wherein the vertical interconnect structure includes a bump or stud bump.

27. The method of claim 24, wherein the first interconnect structure includes an insulating layer comprising an embedded glass cloth, glass cross, filler, or fiber.

28. The method of claim 24, further including disposing a discrete device over the first interconnect structure.

29. The method of claim 25, wherein providing the second interconnect structure further includes:

providing an insulating layer; and forming a conductive layer over the insulating layer.

30. The method of claim 29, wherein the conductive layer contacts the vertical interconnect structure.

* * * * *